(12) United States Patent
Sharan et al.

(10) Patent No.: US 6,759,306 B1
(45) Date of Patent: *Jul. 6, 2004

(54) METHODS OF FORMING SILICON DIOXIDE LAYERS AND METHODS OF FORMING TRENCH ISOLATION REGIONS

(75) Inventors: Sujit Sharan, Boise, ID (US); Gurtej S. Sandhu, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/113,467

(22) Filed: Jul. 10, 1998

Related U.S. Application Data

(62) Division of application No. 09/554,754, filed on May 19, 2000.

(51) Int. Cl.[7] .............................................. H01L 21/76
(52) U.S. Cl. ...................................... 438/424; 438/424
(58) Field of Search ................................ 438/778, 787, 438/788, 424, 707, 708, 723, 724; 427/579; 437/195

(56) References Cited

U.S. PATENT DOCUMENTS

| | | | |
|---|---|---|---|
| 4,839,306 A | | 6/1989 | Wakamatsu .................. 437/67 |
| 5,270,264 A | * | 12/1993 | Andideh et al. ............ 438/703 |
| 5,447,884 A | | 6/1994 | Fahey et al. |
| 5,660,895 A | | 4/1996 | Lee et al. |
| 5,531,834 A | | 7/1996 | Ishizuka et al. |

(List continued on next page.)

FOREIGN PATENT DOCUMENTS

| | | |
|---|---|---|
| EP | 0 843 348 | 11/1997 |
| JP | 07-76777 | 3/1995 |
| JP | 8-8232 | 1/1996 |
| JP | 11-154673 | 6/1999 |
| WO | WO 97/24761 | 7/1997 |

OTHER PUBLICATIONS

Lee et al, "A low Redeposition Rate High Density Plasma CVD Process for High Aspect Ratio 175 nm Technology and Beyond", IEEE International Interconnect Technology Conference, May 1999, pp. 152–154.

Jung et al "Enhancing Uniformity of Borderless VIA Resistance by HDP Oxide Technology" IEEE VLSI & CAD International Conference (ICVC) Feb. 1999 pp. 452–455.

*Primary Examiner*—David Nhu
(74) *Attorney, Agent, or Firm*—Wells St. John P.S.

(57) ABSTRACT

In one aspect, the invention includes a method of forming a silicon dioxide layer, including: a) forming a high density plasma proximate a substrate, the plasma including silicon dioxide precursors; b) forming silicon dioxide from the precursors, the silicon dioxide being deposited over the substrate at a deposition rate; and c) while depositing, etching the deposited silicon dioxide with the plasma at an etch rate; a ratio of the deposition rate to the etch rate being at least about 4:1. In another aspect, the invention includes a method of forming a silicon dioxide layer, including: a) forming a high density plasma proximate a substrate; b) flowing gases into the plasma, at least some of the gases forming silicon dioxide; c) depositing the silicon dioxide formed from the gases over the substrate; and d) while depositing the silicon dioxide, maintaining a temperature of the substrate at greater than or equal to about 500° C. In yet another aspect, the invention includes a method of forming a silicon dioxide layer, including: a) forming a high density plasma proximate a substrate; b) flowing gases into the plasma, at least some of the gases forming silicon dioxide; c) depositing the silicon dioxide formed from the gases over the substrate; and d) not cooling the substrate with a coolant gas while depositing the silicon dioxide.

43 Claims, 3 Drawing Sheets

U.S. PATENT DOCUMENTS

| | | | |
|---|---|---|---|
| 5,614,055 A | * 3/1997 | Fairbairn et al. | 156/345 |
| 5,726,090 A | 5/1997 | Jang et al. | |
| 5,731,241 A | 5/1997 | Jang et al. | |
| 6,077,786 A | 5/1997 | Chakravarti et al. | |
| 5,679,606 A | * 10/1997 | Wang et al. | 437/195 |
| 5,726,097 A | 3/1998 | Yanagida | |
| 6,194,038 B1 | 3/1998 | Rossman | |
| 6,165,854 A | 5/1998 | Wu | |
| 6,174,785 B1 | 6/1998 | Parekh et al. | |
| 5,872,058 A | * 2/1999 | Van Cleemput et al. | 438/692 |
| 5,966,616 A | * 10/1999 | Woertee | 438/424 |
| 5,968,610 A | * 10/1999 | Liu et al. | 427/579 |
| 6,255,211 B1 | 10/1999 | Olsen et al. | |
| 5,976,993 A | * 11/1999 | Ravi et al. | 438/788 |
| 6,013,584 A | * 1/2000 | M'Saad | 438/783 |
| 6,015,759 A | * 1/2000 | Khan et al. | 438/707 |
| 6,030,881 A | * 2/2000 | Papasouliotis et al. | 438/424 |
| 6,103,601 A | * 8/2000 | Lee et al. | 438/513 |
| 6,136,685 A | * 10/2000 | Narwankar et al. | 438/624 |
| 6,114,216 A | 11/2000 | Yieh et al. | |
| 6,153,509 A | 11/2000 | Watanabe et al. | |
| 6,180,490 B1 | * 1/2001 | Vassiliev et al. | 438/424 |
| 6,217,721 B1 | 3/2001 | Xu et al. | |
| 6,340,435 B1 | * 1/2002 | Bjorkman et al. | 216/72 |
| 6,346,302 B2 | 2/2002 | Kishimoto et al. | 427/569 |
| 6,444,037 B1 | * 9/2002 | Frankel et al. | 118/715 |

\* cited by examiner ously filled. As shown in FIG. 1, the deposited
METHODS OF FORMING SILICON DIOXIDE LAYERS AND METHODS OF FORMING TRENCH ISOLATION REGIONS This is a divisional of application of Ser. No. 09/554,754, filed May 19, 2000, the entirre disclosure of which is hereby incorporated by reference.

TECHNICAL FIELD

The invention pertains to methods of forming silicon dioxide layers, such as, for example, methods of forming trench isolation regions.

BACKGROUND OF THE INVENTION

Integrated circuitry is typically fabricated on and within semiconductor substrates, such as bulk monocrystalline silicon wafers. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure including, but not limited to, the semiconductive substrates described above.

Electrical components fabricated on substrates, and particularly bulk semiconductor wafers, are isolated from adjacent devices by insulating materials, such as silicon dioxide. One isolation technique uses shallow trench isolation, whereby trenches are cut into a substrate and are subsequently filled with an insulating material, such as, for example, silicon dioxide. In the context of this document, "shallow" shall refer to a distance of no greater than about 1 micron from an outermost surface of a substrate material within which an isolation region is received.

A prior art method for forming a trench isolation region, such as a shallow trench isolation region, is described with reference to FIGS. 1–2. FIG. 1 illustrates a semiconductor wafer fragment 10 at a preliminary step of the prior art processing method. Wafer fragment 10 comprises a substrate 12, a pad oxide layer 14 over substrate 12, and a silicon nitride layer 16 over pad oxide layer 14. Substrate 12 can comprise, for example, a monocrystalline silicon wafer lightly doped with a p-type background dopant. Pad oxide layer 14 can comprise, for example, silicon dioxide.

Openings 22 extend through layers 14 and 16, and into substrate 12. Openings 22 can be formed by, for example, forming a patterned layer of photoresist over layers 14 and 16 to expose regions where openings 22 are to be formed and to cover other regions. The exposed regions can then be removed to form openings 22, and subsequently the photoresist can be stripped from over layers 14 and 16.

A first silicon dioxide layer 24 is formed within openings 22 to a thickness of, for example, about 100 Angstroms. First silicon dioxide layer 24 can be formed by, for example, heating substrate 12 in the presence of oxygen. A second silicon dioxide layer 26 is deposited within the openings by high density plasma deposition. In the context of this document, a high density plasma is a plasma having a density of greater than or equal to about $10^{10}$ ions/cm$^3$.

FIG. 1 is a view of wafer fragment 10 as opening 22 is partially filled with the deposited silicon dioxide, and FIG. 2 is a view of the wafer fragment after the openings have been completely filled. As shown in FIG. 1, the deposited silicon dioxide undesirably forms cusps 28 at top portions of openings 22. Specifically, cusps 28 are formed over corners of silicon nitride layer 16 corresponding to steps in elevation. The cusp formation (also referred to as "bread-loafing") interferes with subsequent deposition of silicon dioxide layer 26 as shown in FIG. 2. Specifically, the subsequently deposited silicon dioxide can fail to completely fill openings 22, resulting in the formation of voids 29, or "keyholes" within the deposited silicon dioxide layer 26.

After providing second silicon dioxide layer 26 within openings 22, the second silicon dioxide layer is planarized, preferably to a level slightly below an upper surface of nitride layer 16, to form silicon dioxide plugs within openings. The silicon dioxide plugs define trench isolation regions within substrate 12. Such trench isolation regions have voids 29 remaining within them. The voids define a space within the trench isolation regions having a different dielectric constant than the remainder of the trench isolation regions, and can undesirably allow current leakage through the trench isolation regions. Accordingly, it is desirable to develop methods of forming trench isolation regions wherein voids 29 are avoided.

SUMMARY OF THE INVENTION

In one aspect, the invention encompasses a method of forming a silicon dioxide layer. A high density plasma is formed proximate a substrate. The plasma comprises silicon dioxide precursors. Silicon dioxide is formed from the precursors and deposited over the substrate at a deposition rate. While the silicon dioxide is being deposited, it is etched with the plasma at an etch rate. A ratio of the deposition rate to the etch rate is at least about 4:1.

In another aspect, the invention encompasses a method of forming a silicon dioxide layer over a substrate wherein a temperature of the substrate is maintained at greater than or equal to about 500° C. during the deposition. More specifically, a high density plasma is formed proximate a substrate. Gases are flowed into the plasma, and at least some of the gases form silicon dioxide. The silicon dioxide is deposited over the substrate. While the silicon dioxide is being deposited, a temperature of the substrate is maintained at greater than or equal to about 500° C.

In another aspect, the invention encompasses a method of forming a silicon dioxide layer over a substrate wherein the substrate is not cooled during the deposition. More specifically, a high density plasma is formed proximate a substrate. Gases are flowed into the plasma, and at least some of the gases form silicon dioxide. The silicon dioxide is deposited over the substrate. The substrate is not cooled with a coolant gas while depositing the silicon dioxide.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 3:
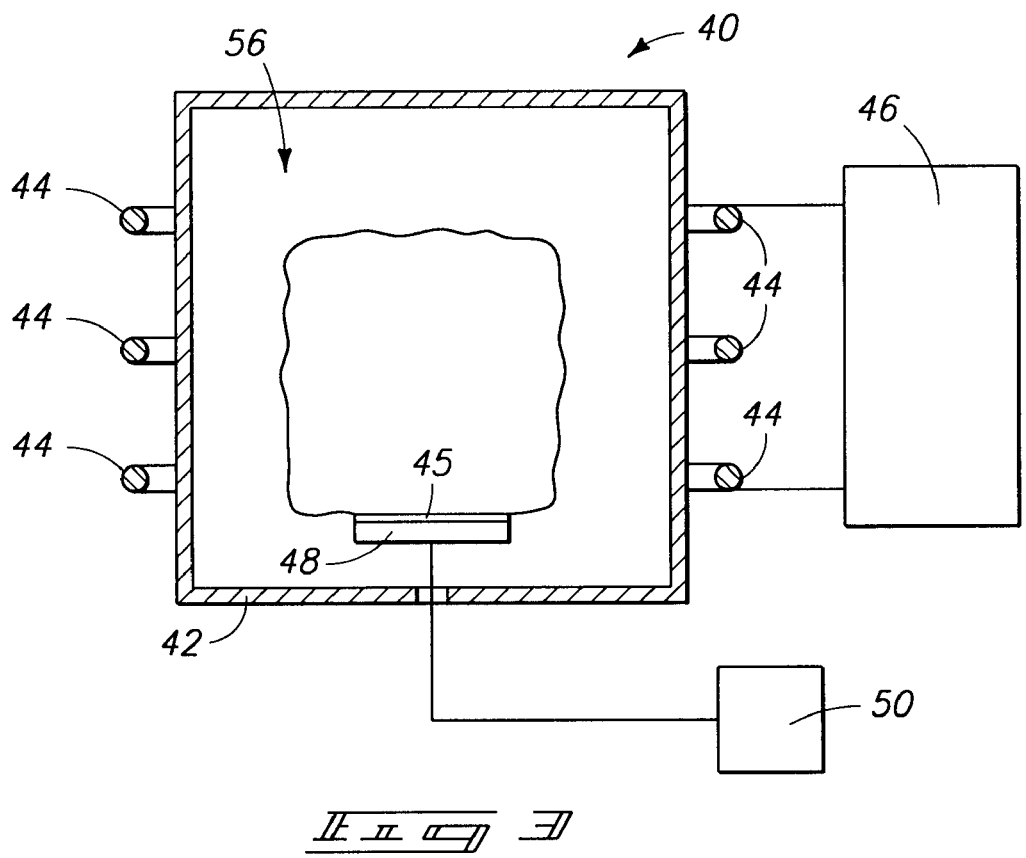
FIG. 3 is a diagrammatic, cross-sectional view of a reaction chamber configured for utilization in a method of the present invention.

The present invention encompasses methods of increasing a deposition to etch ratio in a high density plasma reaction chamber during formation of a silicon dioxide layer. A high density plasma reaction chamber 40 is illustrated in FIG. 3. Reaction chamber 40 comprises a vessel 42 surrounded by inductive coils 44. Inductive coils 44 are connected to a first power source 46 which can be configured to provide power, such as, for example, RF energy, within coils 44. Reaction chamber 40 further comprises a chuck 48 configured for holding a semiconductive wafer 45 within vessel 42. Wafer 45 is connected through chuck 48 to a power source 50 which can be configured to, for example, produce RF energy within wafer 45.

In operation, plasma precursor gasses (not shown) are flowed into vessel 42. Power source 46 is utilized to provide a first bias, of, for example, a power of from about 1000 watts to about 8000 watts to inductive coils 44, which generates a plasma 56 within vessel 42. Second power source 50 is utilized to provide a second bias, of, for example, a power of from about 1000 watts to about 5000 watts to wafer 45.

Among the plasma precursor gasses are silicon dioxide precursors such as, for example, $SiH_4$ and oxygen, as well as other plasma components, such as, for example, Ar. Plasma 56 can, for example, be formed from a gas consisting essentially of $SiH_4$, $O_2$ and Ar. The silicon dioxide precursors form silicon dioxide which is deposited on wafer 45 at a deposition rate. Also, during the depositing, the silicon dioxide is etched at an etch rate.

In prior art processes, the chuck is cooled to maintain the wafer at a temperature of less than or equal to 300° C. In contrast, in a process of the present invention, chuck 48 is not cooled. Accordingly, wafer 10 is permitted to heat within vessel 42 during a present invention deposition process by energy transferred from plasma 56. Preferably, wafer 45 is maintained at temperatures of at least about 500° C., but preferably is removed before its temperature exceeds about 1000° C.

It is observed that a significant etch of the deposited material occurs primarily when wafer 45 is biased within vessel 42. Accordingly, a method for measuring the deposition rate is to remove any bias power from wafer 45, and to keep other reaction parameters appropriate for deposition of silicon dioxide. Silicon dioxide will then be deposited on wafer 45 without etching.

To determine an etch rate occurring within chamber 42 during a deposition process, a wafer 45 having an exposed layer of silicon dioxide is provided within the reaction chamber. The reaction parameters within the chamber are then adjusted as they would be for a deposition process, with the wafer being biased as would occur in a typical deposition process, but there being no feed of silicon dioxide precursors to the chamber. Accordingly, etching of the silicon dioxide layer occurs without additional growth of silicon dioxide.

Measurements conducted relative to a prior art high density plasma deposition process reveal that a ratio of the deposition rate to the etch rate is less than about 3.4:1 for trenches having an aspect ratio of from about 2.5 to about 1. In contrast measurements conducted relative to a high density plasma deposition process of the present invention reveal that by maintaining wafer 45 at temperatures of at least about 500° C., the ratio of the deposition rate to the etch rate can be increased to at least about 4:1, more preferably to at least about 6:1, and still more preferably to at least about 9:1. The ratio of deposition rate to etch rate varies with an aspect ratio of a trench being filled.

It is observed that the void formation described above with reference to FIG. 1 can be reduced, or even eliminated, by increasing a deposition-to-etch ratio of a high density plasma deposition process.

Figure 1:
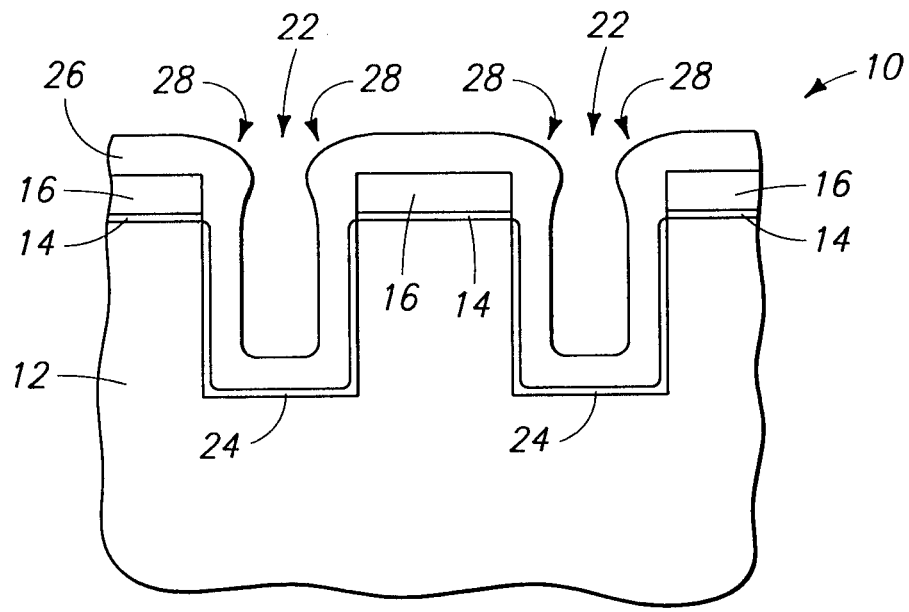
FIG. 1 is a fragmentary, diagrammatic, cross-sectional view of a semiconductor wafer fragment at a preliminary step of a prior art fabrication process.
Figure 4:
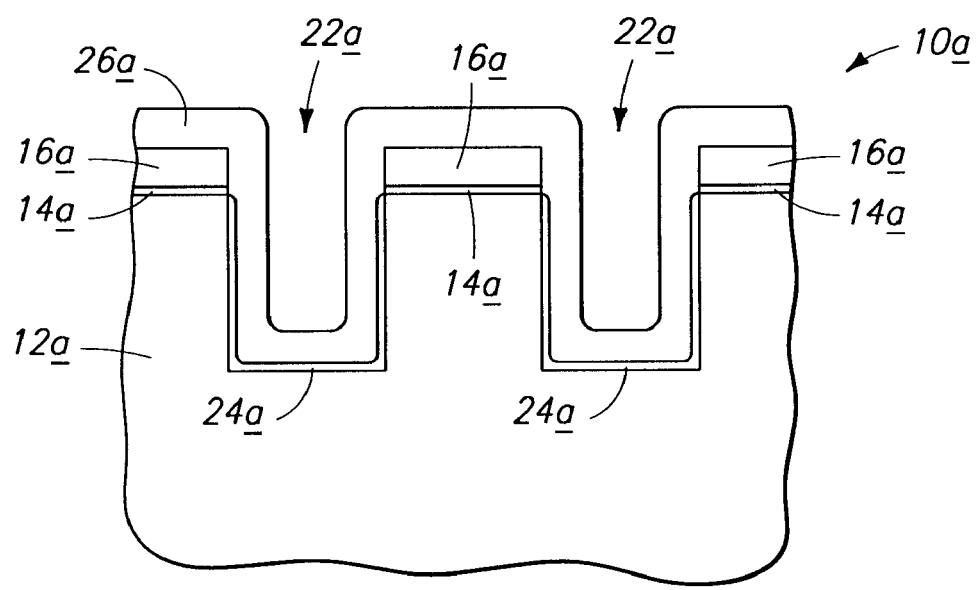
FIG. 4 is a diagrammatic cross-sectional view of a semiconductor wafer fragment processed in accordance with the present invention. The wafer fragment of FIG. 4 is shown at a processing step similar to the prior art processing step shown in FIG. 1.
Figure 5:
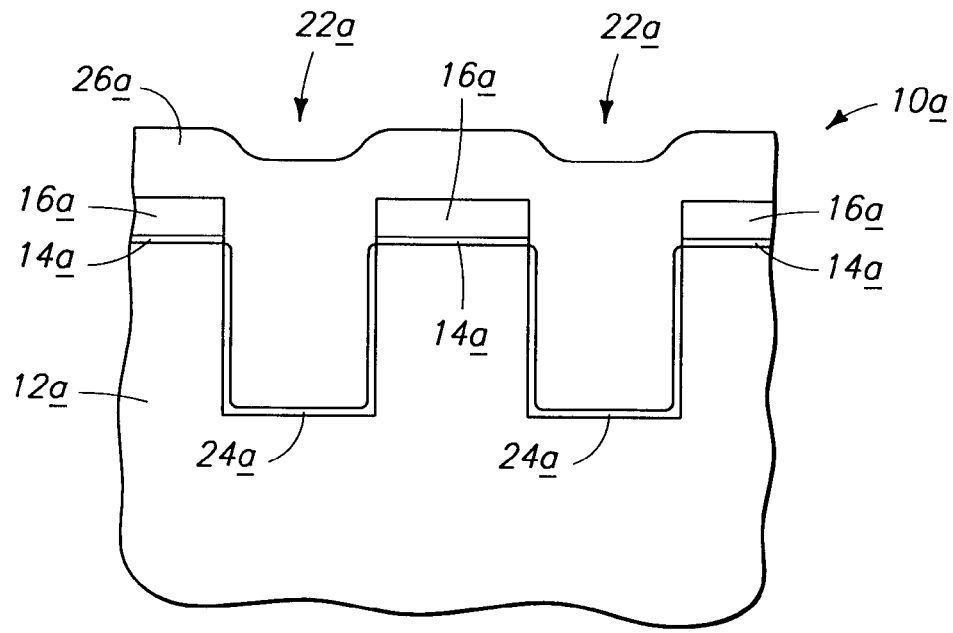
FIG. 5 is a view of the FIG. 4 wafer fragment shown at a processing step subsequent to that of FIG. 4.
Figure 6:
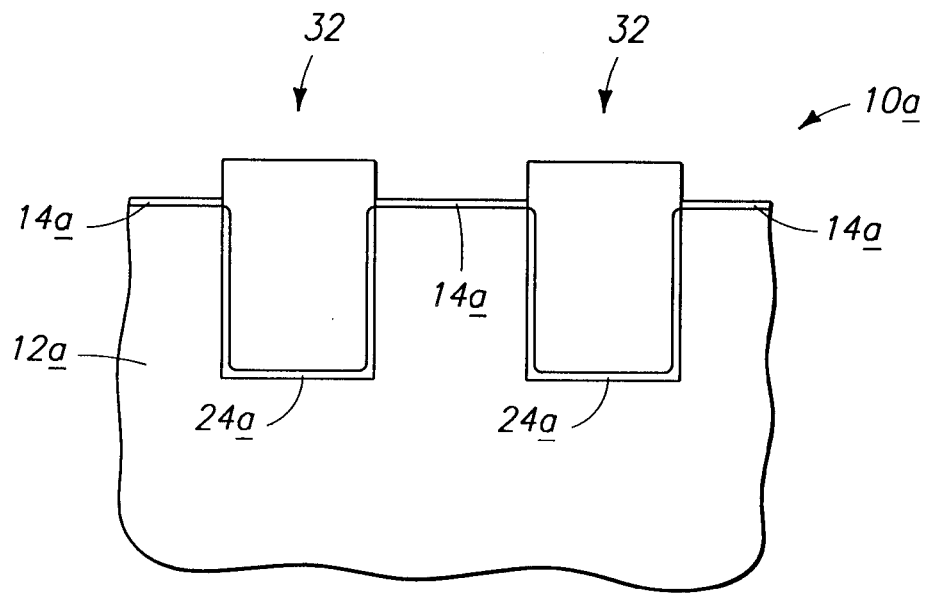
FIG. 6 is a view of the FIG. 4 wafer fragment shown at a processing step subsequent to that of FIG. 5.

Referring to FIGS. 4–6, a deposition process of the present invention is illustrated. In describing FIGS. 4–6, similar numbering to that utilized above in describing the prior art FIGS. 1 and 2 will be used, with differences indicated by the suffix "a" or by different numerals. FIG. 4 illustrates a semiconductor wafer fragment 10a shown at a processing step corresponding to that of the prior art wafer fragment 10 of FIG. 1. Wafer fragment 10a can, for example, be a portion of the wafer 45a illustrated in FIG. 3. Wafer fragment 10a comprises a layer of silicon dioxide 26a deposited over a substrate 12a and within openings 22a. A difference between wafer fragment 10a of FIG. 4, and wafer fragment 10 of FIG. 1, is that the high deposition-toetch ratio of the present invention has significantly eliminated cusps 28 (FIG. 1). In other words, the high deposition-to-etch ratio of the present invention has achieved a more conformal coating of silicon dioxide layer 26a over the elevational step of an upper corner of nitride layer 16 than could be achieved with prior art processing methods. Such more conformal coating can be referred to as "better step coverage".

Figure 2:
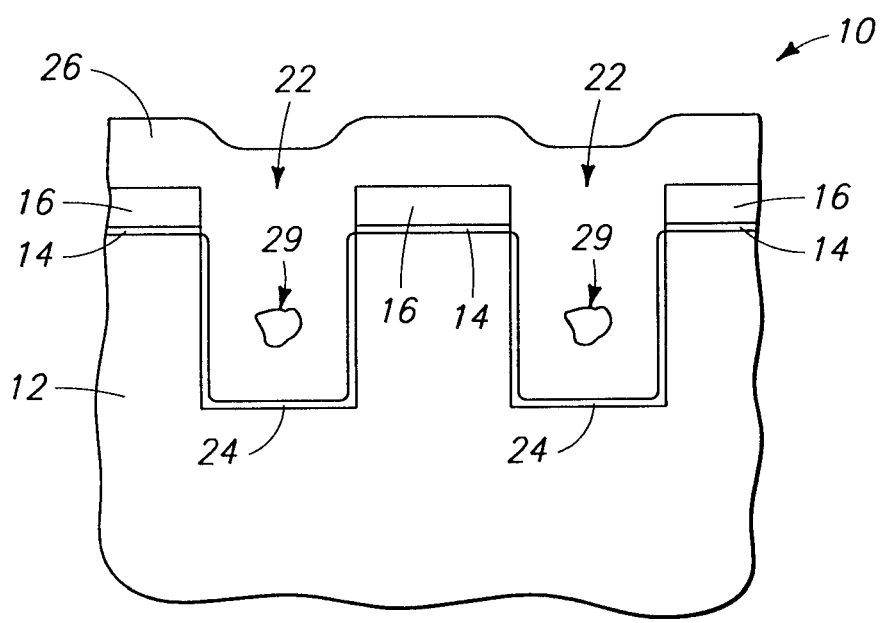
FIG. 2 is a view of the FIG. 1 wafer fragment shown at a prior art processing step subsequent to that of FIG. 1.

Referring to FIG. 5, wafer fragment 10a is illustrated after silicon dioxide deposition has progressed to fill openings 22a with silicon dioxide layer 26a. Wafer fragment 10a of FIG. 5 is illustrated at a processing step analogous to the prior art step illustrated in FIG. 2. A difference between wafer fragment 10a of FIG. 5 and prior art wafer fragment 10 of FIG. 2 is that keyholes 29 are eliminated from fragment 10a.

Referring to FIG. 6, wafer fragment 10a is illustrated after planarizing silicon dioxide layer 26a (FIG. 5) and removing silicon nitride layer 16 to form shallow trench isolation regions 32. Shallow trench isolation regions 32 comprise the planarized second silicon dioxide layer and thermally grown silicon dioxide 24a. Trench isolation regions 32 lack the voids 29 that had been problematic in prior art trench isolation regions.

It is noted that the process of the present invention is described with reference to the reaction chamber construction of FIG. 3 for purposes of illustration only. The present invention can, of course, be utilized with other reaction chamber constructions, such as, for example, transformer coupled plasma reactors.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a silicon dioxide layer, comprising:
   forming a high density plasma proximate a substrate;
   flowing gases into the plasma, at least some of the gases forming silicon dioxide;
   depositing the silicon dioxide formed from the gases over the substrate; and
   while depositing the silicon dioxide, maintaining a temperature of the substrate at greater than 700° C. to about 1000° C.

2. The method of claim 1 further comprising:
   forming openings in the substrate; and
   depositing the silicon dioxide within the openings.

3. The method of claim 1 wherein the gases comprise $SiH_4$ and oxygen.

4. The method of claim 1 wherein the gases comprise $SiH_4$, oxygen and argon.

5. A method of forming a silicon dioxide layer, comprising:
   forming a high density plasma proximate a substrate;
   flowing gases into the plasma, at least some of the gases forming silicon dioxide;
   depositing the silicon dioxide formed from the gases over the substrate
   without cooling the substrate with a coolant gas while depositing the silicon dioxide.

6. The method of claim 5 further comprising maintaining a temperature of the substrate at greater than or equal to 500° C. during the depositing.

7. A method of forming a silicon dioxide layer, comprising:
   forming a high density plasma proximate a substrate;
   flowing gases into the plasma, at least some of the gases forming silicon dioxide;
   depositing the silicon dioxide formed from the gases over the substrate at a deposition rate;
   while depositing, etching the deposited silicon dioxide with the plasma at an etch rate; and
   during the etching and depositing, maintaining a temperature of the substrate at greater than 700° C. to about 1000° C.

8. The method of claim 7 wherein the gases comprise $SiH_4$ and oxygen.

9. The method of claim 7 wherein the gases comprise $SiH_4$, oxygen and argon.

10. The method of claim 7 further comprising:
    forming openings in the substrate; and
    depositing the silicon dioxide within the openings.

11. A method of forming a silicon dioxide layer, comprising:
    forming a high density plasma proximate a substrate;
    flowing gases into the plasma, at least some of the gases forming silicon dioxide;
    depositing the silicon dioxide formed from the gases over the substrate at a deposition rate;
    while depositing, etching the deposited silicon dioxide with the plasma at an etch rate; and
    during the etching and depositing, maintaining a temperature of the substrate at greater than or equal to about 500° C., the maintaining a temperature comprising not exposing the substrate to a coolant gas.

12. A method of forming a silicon dioxide layer, comprising:
    forming a high density plasma proximate a substrate;
    flowing gases into the plasma, at least some of the gases forming silicon dioxide;
    depositing the silicon dioxide formed from the gases over the substrate at a deposition rate; and
    while depositing, etching the deposited silicon dioxide with the plasma at an etch rate under elevated temperature conditions to achieve a ratio of deposition rate to etch rate of at least about 6:1 throughout the etching and depositing until completing formation of the silicon dioxide layer, the ratio being at least two-times greater than another ratio under identical processing conditions of an identical substrate except at lower temperature conditions less than or equal to 300° C.

13. A method of forming a silicon dioxide layer, comprising:
    forming a high density plasma proximate a substrate, the plasma comprising silicon dioxide precursors, the substrate comprising an opening having an aspect ratio of at least about 1;
    forming silicon dioxide from the precursors, the silicon dioxide being deposited within the opening at a deposition rate; and
    while depositing, etching the silicon dioxide deposited within the opening, the etching comprising etching with the plasma at an etch rate; a ratio of the deposition rate to the etch rate being at least about 6:1 throughout the etching and depositing until completing formation of the silicon dioxide layer.

14. The method of claim 13 wherein the opening has an aspect ratio of from about 2.5 to about 1.

15. The method of claim 13 further comprising:
    placing the substrate in a reaction chamber, the reaction chamber comprising inductive coils to generate the plasma; the depositing and etching occurring in the reaction chamber;
    providing a first bias to the inductive coils; and
    during the etching, providing a second bias to the substrate.

16. A method of forming a silicon dioxide layer, comprising:
    forming a high density plasma proximate a substrate, the substrate comprising an opening having an aspect ratio of at least about 1;
    flowing gases into the plasma, at least some of the gases forming silicon dioxide;
    depositing the silicon dioxide formed from the gases within the opening at a deposition rate; and
    while depositing, etching the silicon dioxide deposited within the opening with the plasma at an etch rate; a ratio of the deposition rate to the etch rate being at least about 6:1 throughout the etching and depositing until completing formation of the silicon dioxide layer.

17. The method of claim 16 wherein the opening has an aspect ratio of from about 2.5 to about 1.

18. The method of claim 16 further comprising maintaining a temperature of the substrate at greater than 700° C. to about 1000° C.

19. The method of claim 16 wherein the ratio of the deposition rate to the etch rate is at least about 9:1.

20. The method of claim 16 further comprising maintaining a temperature of the substrate at greater than or equal to about 500° C. during the deposition and etching.

21. The method of claim 16 further comprising:
forming openings in the substrate; and
depositing the silicon dioxide within the openings.

22. The method of claim 16 wherein the gases comprise $SiH_4$ and oxygen.

23. The method of claim 16 wherein the gases comprise $SiH_4$, oxygen and argon.

24. The method of claim 16 wherein the gases are a mixture consisting essentially of $SiH_4$, oxygen and argon.

25. A method of forming a silicon dioxide layer, comprising:
forming a high density plasma proximate a substrate, the substrate comprising a step;
flowing gases into the plasma, at least some of the gases forming silicon dioxide;
depositing the silicon dioxide formed from the gases over the substrate step; and
while depositing the silicon dioxide, maintaining a temperature of the substrate at greater than 700° C. to about 1000° C., the depositing achieving better step coverage than another step coverage at lower temperatures less than or equal to 300° C.

26. The method of claim 25 further comprising:
forming openings in the substrate; and
depositing the silicon dioxide within the openings.

27. The method of claim 25 wherein the gases comprise $SiH_4$ and oxygen.

28. The method of claim 25 wherein the gases comprise $SiH_4$, oxygen and argon.

29. The method of claim 11 wherein the substrate temperature is from greater than 700° C. to about 1000° C. during at least part of the depositing.

30. The method of claim 1 wherein the depositing exhibits a deposition rate to etch rate ratio of at least about 4:1 throughout the depositing until completing formation of the silicon dioxide layer.

31. The method of claim 12 wherein the substrate temperature is from greater than 700° C. to about 1000° C. during at least part of the depositing.

32. The method of claim 7 wherein the depositing and etching exhibit a deposition rate to etch rate ratio of at least about 4:1 throughout the depositing and etching until completing formation of the silicon dioxide layer.

33. The method of claim 1 further comprising, while depositing the silicon dioxide at a deposition rate, etching the deposited silicon dioxide with the plasma at an etch rate, a ratio of the deposition rate to the etch rate being at least about 6:1 throughout the etching and depositing until completing formation of the silicon dioxide layer.

34. The method of claim 1 further comprising, while depositing the silicon dioxide at a deposition rate, etching the deposited silicon dioxide with the plasma at an etch rate to achieve a ratio of deposition rate to etch rate that is at least two-times greater than another etch rate under identical processing conditions of an identical substrate except at lower temperature conditions less than or equal to 300° C.

35. The method of claim 5 further comprising maintaining a temperature of the substrate at greater than 700° C. to about 1000° C. during the depositing.

36. The method of claim 5 further comprising, while depositing the silicon dioxide at a deposition rate, etching the deposited silicon dioxide with the plasma at an etch rate, a ratio of the deposition rate to the etch rate being at least about 6:1 throughout the etching and depositing until completing formation of the silicon dioxide layer.

37. The method of claim 5 further comprising, while depositing the silicon dioxide at a deposition rate, etching the deposited silicon dioxide with the plasma at an etch rate to achieve a ratio of deposition rate to etch rate that is at least two-times greater than another etch rate under identical processing conditions of an identical substrate except at lower temperature conditions less than or equal to 300° C.

38. The method of claim 1 further comprising, while depositing the silicon dioxide, etching the deposited silicon dioxide with the plasma.

39. The method of claim 25 further comprising, while depositing the silicon dioxide, etching the deposited silicon dioxide with the plasma.

40. The method of claim 1 wherein the depositing achieves better step coverage than another step coverage at lower temperatures less than or equal to 300° C.

41. The method of claim 7 wherein the etching and depositing achieves better step coverage than another step coverage at lower temperatures less than or equal to 300° C.

42. The method of claim 13 wherein the ratio is at least two-times greater than another ratio under identical processing conditions of an identical substrate except at lower temperature conditions less than or equal to 300° C.

43. The method of claim 16 wherein the ratio is at least two-times greater than another ratio under identical processing conditions of an identical substrate except at lower temperature conditions less than or equal to 300° C.

* * * * *

UNITED STATES PATENT AND TRADEMARK OFFICE
CERTIFICATE OF CORRECTION

PATENT NO. : 6,759,306 B1
DATED : July 10, 1998
INVENTOR(S) : Sujit Sharan et al.

It is certified that error appears in the above-identified patent and that said Letters Patent is hereby corrected as shown below:

Title page,
Item [62], Related U.S. Application Data, delete "Division of application no. 09/554,754, filed on May 19, 2000.".

Column 1,
Lines 5-7, delete "This is a divisional of application of Ser. No. 09/554,754, filed May 19, 2000, the entirre disclosure of which is hereby incorporated by reference.".

Column 4,
Line 32, replace "fragment 10 of Fig. 1, is that the high deposition-toetch ratio" with -- fragment 10 of Fig. 1, is that the high deposition-to-etch ratio --.

Signed and Sealed this

Thirty-first Day of January, 2006

JON W. DUDAS
*Director of the United States Patent and Trademark Office*

UNITED STATES PATENT AND TRADEMARK OFFICE
CERTIFICATE OF CORRECTION

PATENT NO. : 6,759,306 B1
DATED : July 6, 2004
INVENTOR(S) : Sujit Sharan et al.

It is certified that error appears in the above-identified patent and that said Letters Patent is hereby corrected as shown below:

Title page,
Item [62], Related U.S. Application Data, delete "Division of application no. 09/554,754, filed on May 19, 2000.".

Column 1,
Lines 5-7, delete "This is a divisional of application of Ser. No. 09/554,754, filed May 19, 2000, the entirre disclosure of which is hereby incorporated by reference.".

Column 4,
Line 32, replace "fragment 10 of Fig. 1, is that the high deposition-toetch ratio" with -- fragment 10 of Fig. 1, is that the high deposition-to-etch ratio --.

This certificate supersedes Certificate of Correction issued January 30, 2006.

Signed and Sealed this

Fourteenth Day of March, 2006

JON W. DUDAS
*Director of the United States Patent and Trademark Office*